United States Patent [19]

Perandi

[11] Patent Number: 4,801,893
[45] Date of Patent: Jan. 31, 1989

[54] FORWARD TRANSIMPEDANCE AMPLIFIER

[75] Inventor: Aado J. Perandi, 3864 Midland Ave., White Bear Lk., Minn. 55110

[73] Assignees: Frank L. VanAlstine; Aado J. Perandi; David H. Umeda, all of Burnsville, Minn.

[21] Appl. No.: 905,841

[22] Filed: Sep. 10, 1986

[51] Int. Cl.$^4$ .............................................. H03F 3/45
[52] U.S. Cl. .................................... 330/300; 330/255; 330/264; 330/293
[58] Field of Search ............... 330/255, 264, 269, 277, 330/293, 300, 311

[56] References Cited

U.S. PATENT DOCUMENTS 4,420,724 12/1983 Owen .............................. 330/300 X
4,553,108 11/1985 Young .................................. 330/300

OTHER PUBLICATIONS

Roberts et al., "Instrument Output Amplifier", *Wireless World*, Mar. 1969.

Roberts et al., "M.O.S.-Bipolar Amplifiers," *Wireless World*, Jul. 1969, pp. 328-330.

Sedon, "A Universal Spectrometric Preamplifier", *Instruments and Experimental Techniques*, vol. 19, No. 1, Pt. 2, pp. 153-154, Jan.-Feb. 1976 (Publ. Aug. 1976).

Primary Examiner—James B. Mullins
Attorney, Agent, or Firm—Merchant, Gould, Smith, Edell, Welter & Schmidt

[57] ABSTRACT

Improved forward transimpedance amplifiers are provided using a field effect transistor first amplification stage, direct coupled to a bipolar junction transistor second amplification stage. In some embodiments an optional third bipolar junction transistor amplification stage is provided, direct coupled from the second stage. Negative feedback signals are connected from the output of the bipolar junction transistor stage to the input of the field effect transistor stage. The invention provides simple and low-cost amplifiers with very high forward transimpedance and other performance characteristics approaching those of an ideal amplifier, permitting the realization of a nearly ideal transimpedance amplifier with performance characteristics dominated by its feedback network.

5 Claims, 3 Drawing Sheets

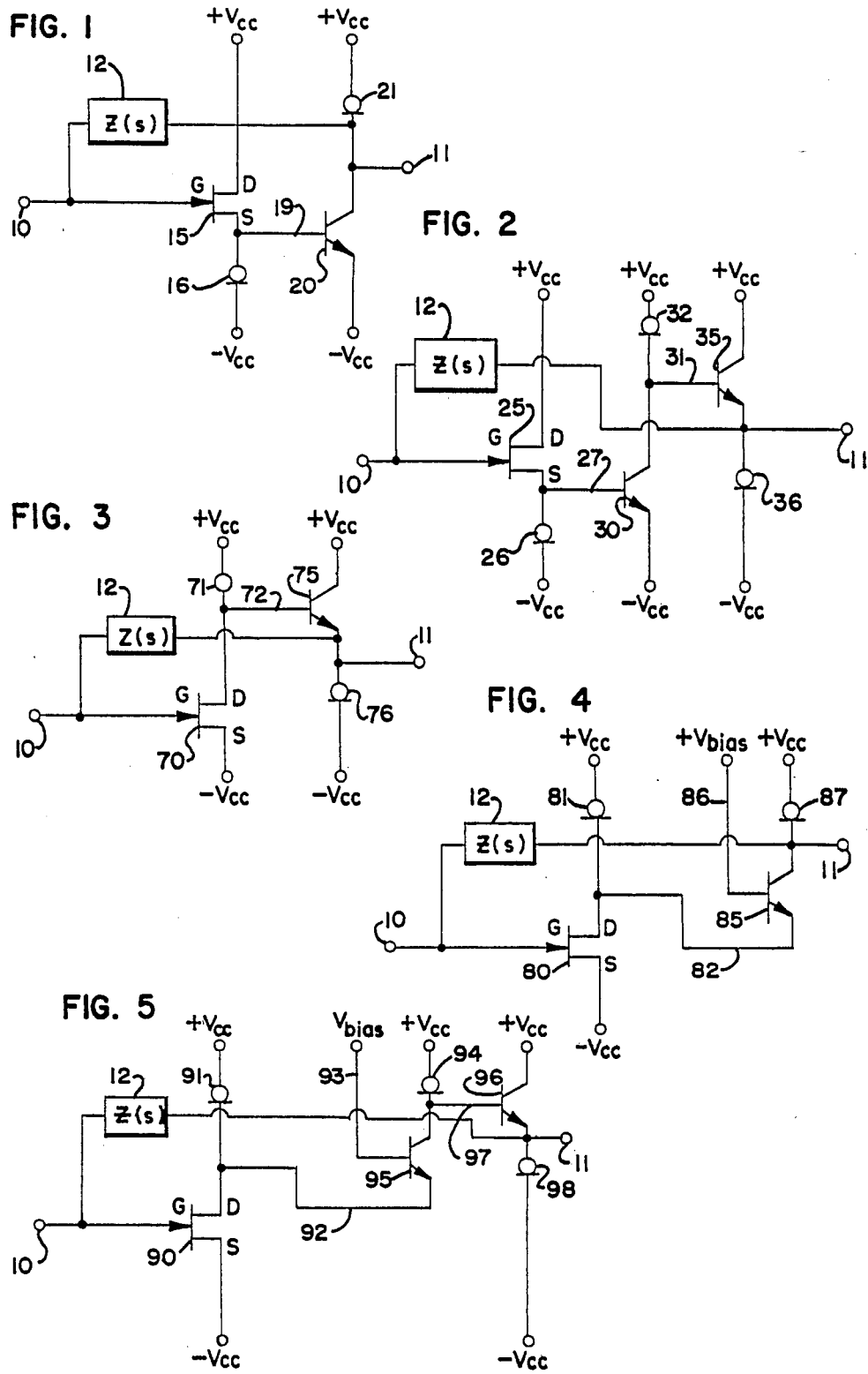

FORWARD TRANSIMPEDANCE AMPLIFIER

FIELD OF THE INVENTION

This invention pertains generally to the field of electronic amplifiers, and specifically t amplifier designs having improved forward transimpedance characteristics which make them advantageous for use in a wide variety of applications.

BACKGROUND OF THE PRIOR ART

Electronic amplifiers are fundamental building blocks used in virtually every field of electronics, and over the years a great number of amplifier designs have evolved for specific applications. The designer of an amplifier or an electronic system using amplifiers must make choices among various performance and cost parameters in trying to achieve the best amplifier for a given application. Such variables as input and output impedance, voltage gain, current gain, forward transconductance, forward transimpedance, frequency response, distortion, bias requirements, stability, and the like, must be considered and often balanced one against the other for a given application. For many applications, integrated circuit operational amplifiers are selected with the intent that external connections for input and feedback will give the required operating characteristics, but this is not always the case. All real amplifier designs including operational amplifiers fall short of ideal characteristics to some extent, and the nature of the particular shortcomings will determine how well a given amplifier or operational amplifier will perform in a given application. Moreover, at the integrated circuit design level, the designer is still faced with the task of designing and laying out device configurations to achieve the desired amplifier characteristics. In many cases, shortcomings in certain amplifier performance parameters have been overcome by more complex designs having higher gain which permits greater amounts of negative feedback to linearize and stabilize the amplifier. However, such approach can lead to problems in transient response and high frequency response.

In many applications a simple but rugged amplifier is needed having low distortion characteristics for driving some downstream device or circuit in response to an input current. Numerous examples occur in the fields of audio, video, communications, computers and control systems. An ideal transimpedance amplifier transforms an input current to an output voltage by a given ratio, and would ideally have zero input and output impedance, infinite frequency response and slew rate, zero distortion, zero input bias currents, unlimited available output current, and transimpedance determined only by feedback impedance. The ideal transimpedance amplifier would also have infinite voltage gain, infinite current gain, and infinite forward transconductance.

A transimpedance amplifier is usually configured as an amplifier having a transfer function H(s) within a feedback network Z(s). If the characteristics of the amplifier portion are ideal (infinite input impedance, zero output impedance, infinite voltage and current gain, infinite forward transconductance, infinite forward transimpedance, infinite frequency response, infinite slew rate, zero distortion, zero input bias currents, and unlimited available output current), then the transconductance amplifier constructed will be ideal, with the transimpedance determined by the value of the feedback impedance Z(s).

One simple type of transimpedance amplifier uses a single stage bipolar transistor amplifier connected in a common emitter configuration. The chief advantages of the amplifier portion in this configuration are its low cost, high transconductance and high voltage gain. However, the current gain and forward transimpedance are relatively low. This type of circuit is often improved by providing an input emitter follower stage followed by the common emitter stage, to provide improvements in current gain and forward transimpedance. Another alternative uses a pair of transistors connected as a Darlington pair, to provide much the same advantages. Another commonly used amplifier design is a differential input amplifier stage. This can provide about twice the current gain and twice the forward transimpedance of a simple common emitter bipolar stage. All of these circuits can be further improved by adding additional stages to increase the amplification, but at the disadvantage of added cost, complexity, and in some cases, distortion.

In the above-described prior art circuits, the current gain and forward transimpedance may still be inadequate for many purposes. In addition, an unsatisfactory trade-off must be made between low input bias currents or fast slew rates, but not both simultaneously.

SUMMARY OF THE INVENTION

These and other problems with prior art amplifier designs can be eliminated by improved amplifier designs according to this invention. According to the present invention, a field effect transistor (FET) first stage is provided, and this is coupled to a bipolar junction transistor (BJT) second stage. An optional third stage may also be provided. This configuration takes advantage of the best characteristics of both transistor types. The field effect transistor first stage is essentially a voltage controlled device, and this provides high current gain and high forward transimpedance. However, the FET stage by itself would have relatively low voltage gain and forward transconductance. The bipolar junction transistor second stage complements the FET first stage and provides high voltage gain and high forward transconductance. The resulting combination provides the advantages of high forward transimpedance and the other characteristics of an ideal amplifier, which allows one to design a nearly ideal transimpedance amplifier, dominated by its feedback network.

These advantages are achieved by a two or three stage amplifier using a field effect transistor first amplification stage, a bipolar junction transistor second amplification stage, and, if used, a bipolar junction transistor third amplification stage. Input means are provided for applying signals to be amplified to the first amplification stage, and means are provided for the direct coupling of signals from the output of the first amplification stage to the input of the second amplification stage. If a third amplification stage is used, then means are provided for the direct coupling of signals from the output of the second amplification stage to the input of the third amplification stage. Output means are connected to receive amplified signals from the output of the last amplification stage, and feedback means are connected to convey negative feedback signals from the output of the last amplification stage to the input of the first stage. One of the first two stages is inverting while the other is non-inverting and the third stage, if used, is non-inverting.

BRIEF DESCRIPTION OF THE DRAWINGS

In the drawings,

FIG. 1 is an electrical schematic diagram of a transimpedance amplifier according to a first embodiment of the invention;

FIG. 2 is a schematic diagram according to a second embodiment of the invention;

FIG. 3 is a schematic diagram according to a third embodiment of the invention;

FIG. 4 is a schematic diagram according to a fourth embodiment of the invention;

FIG. 5 is a schematic diagram according to a fifth embodiment of the invention.

DETAILED DESCRIPTION OF THE PREFERRED EMBODIMENTS

Figure 6A:
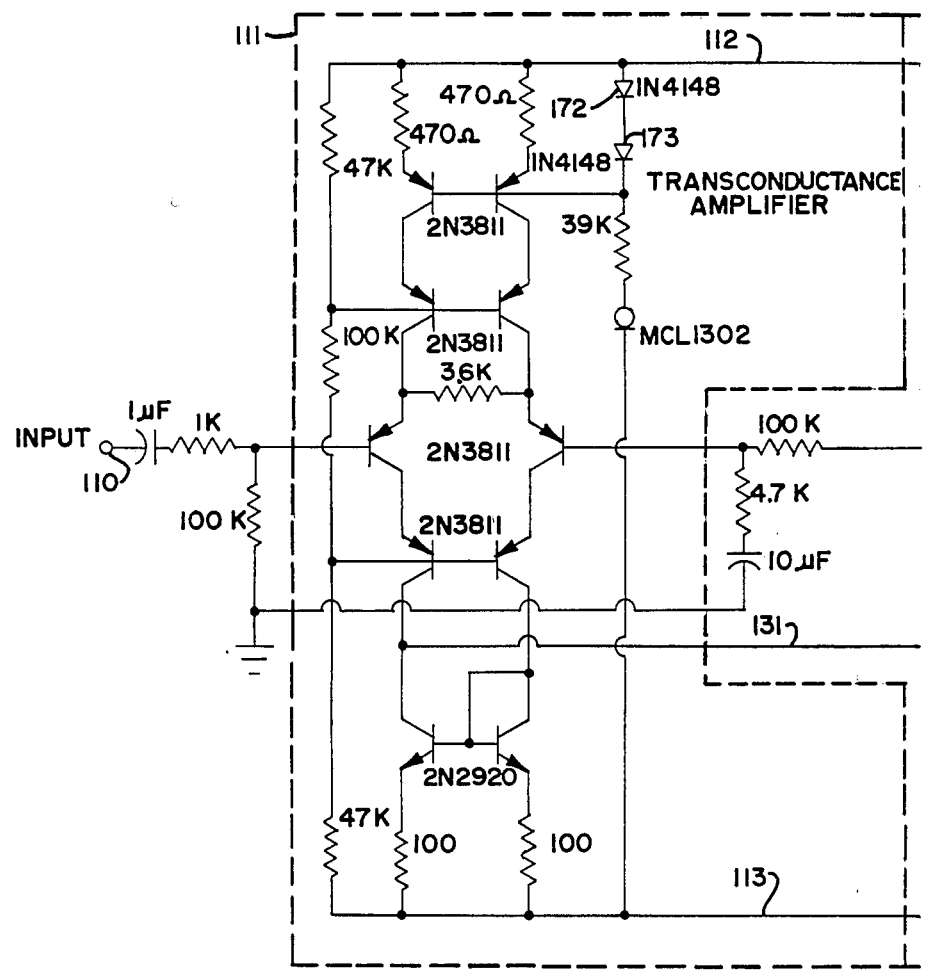
FIGS. 6a and 6b are an electrical schematic diagram of an audio power amplifier using an improved forward transimpedance amplifier according to the present invention.

As previously mentioned, an important feature of the present invention is the use of a field effect transistor (FET) as a first stage and a bipolar junction transistor (BJT) as a second stage in order to make best use of their respective advantages. The FET can either be a metal oxide semiconductor field effect transistor (MOSFET) or a junction field effect transistor (JFET).

All of the embodiments use two- or three-stage designs. Each stage is a direct coupled design containing a single transistor along with its power supply, biasing and output load circuits. The transistors can be either N-channel or P-channel devices, in the cases of the FETs, or NPN or PNP devices in the case of the BJTs, assuming the appropriate power supply and biasing changes are made. In the embodiments of FIGS. 1-5, N-channel and NPN types are shown, but it will be appreciated that the other types of transistors can be used by making the appropriate corresponding changes in power supply and biasing conditions. The current sources shown in FIGS. 1-5 provide for output load and biasing of the individual stages, for example, current sources 16 and 21 in FIG. 1, and the corresponding current sources in the other figures. These current sources can be implemented using any types of constant current circuits using BJT, MOSFET or JFET technologies, constant current diodes, or they may be implemented simply by using resistors to provide a useful approximation of a current source for many applications.

FIG. 1 shows one embodiment of the invention. Reference number 10 designates the signal input and reference number 11, the signal output. A feedback impedance is indicated by reference 12, and connects from the output 11 to the input 10. The amplifier includes a first amplification stage which comprises FET 15 and its associated bias connections, and a second amplification stage which comprises BJT 20 and its associated bias connections. Specifically, the gate of FET 15 is connected to input 10, and its drain is connected to a source of positive bias voltage $+V_{CC}$. The source of FET 15 connects through a current source or load 16 to negative voltage source $-V_{CC}$. The source of FET 15 is directly connected to the base of BJT 20 via conductor 19. The emitter of BJT 20 connects to $-V_{CC}$, and its collector connections to output 11. A current source or load 21 connects from the collector of BJT 20 to $+V_{CC}$.

FET 15 is thus connected in common drain configuration, and provides current gain and unity voltage gain for signals applied to its gate. BJT 20 is connected in common emitter configuration, and provides all of the voltage gain and forward transconductance, and along with FET 15 provides very high current gain and very high forward transimpedance. Since BJT 20 thus connected provides signal-inverting amplification and FET 15 provides noninverting amplification, the overall amplifier provides inverting operation so that impedance 12 provides the desired negative feedback to the input.

In general, for each of the embodiments of the invention, inverting operation and negative feedback is needed. This can be achieved by ensuring that one of the stages of the two-stage designs is signal-inverting, and that an odd number of stages of the three-stage designs is inverting. The desired inverting operation can be achieved through choice of circuit connections which determines transistor configuration.

The nearly ideal transimpedance characteristics are achieved through the use of a circuit design that approaches an ideal amplifier within the feedback loop. An FET device used in the first stage provides low input bias currents and a very high input impedance. This means that the current gain and forward transimpedance of the amplifier portion of the circuit are very high. A BJT transistor has high voltage gain and high forward transconductance, which when used in the second stage ideally complements the inadequate characteristics of the FET in the first stage.

Various configurations have been analyzed mathematically and tested experimentally to demonstrate the improved characteristics of the improved forward transimpedance amplifier. Since the characteristics of an entire circuit are dependent upon the characteristics of each individual device along with the connecting circuit topology, one may go through a number of design iterations to determine the best combination of parts and circuit topology for any given use.

The embodiment of FIG. 2 is in many respects similar to FIG. 1, but uses a third BJT amplification stage as part of the output. The amplifier of FIG. 2 includes signal input 10, signal output 11, and feedback 12 as in the previous embodiment. The first amplification stage includes FET 25, whose gate is connected to receive input signals to be amplified from input 10. The drain of FET 25 connects to $+V_{CC}$, and the source connects through current source 26 to $-V_{CC}$. The source terminal also connects via conductor 27 to the base of BJT 30, which comprises the second amplification stage. The emitter of transistor 30 connects to $-V_{CC}$, and the collector circuit connects via conductor 31 through current source 32 to $+V_{CC}$.

Rather than connecting directly from the collector of the second stage transistor to the output, as was the case in the embodiment of FIG. 1, the embodiment of FIG. 2 uses a third amplification stage as part of the signal output. Conductor 31 connects to the base of a second BJT 35. The collector of this transistor connects to $+V_{CC}$, and the emitter connects to output 11, and through current source 36 to $-V_{CC}$. The amplifier of FIG. 2 thus provides a three-stage, direct coupled improved forward transimpedance amplifier, with signal inversion and feedback connected from output to input. The first stage is an FET connected in common drain configuration; the second stage is a BJT connected in common emitter configuration; and the third stage is a BJT connected in common collector configuration.

The embodiment of FIG. 3 uses FET 70 and its bias connections including current source 71 as a common source configured first stage, and BJT 75 and its bias connections including current source 76 as a common collector configured second amplification stage. The two stages are direct coupled by conductor 72 which connects from the drain of FET 70 to the base of BJT 75.

In the embodiment of FIG. 4, the first amplification stage comprises FET 80 which, together with its bias connections including current source 81, is connected in common source configuration. The second amplification stage consists of BJT 85 connected in common base configuration, with its emitter direct coupled by conductor 82 to the drain of FET 80, its base connected via conductor 86 to a bias voltage and its collector circuit connected to output 11 and through current source 87 to $V_{CC}$.

The embodiment of FIG. 5 is similar to that of FIG. 4, in that it has a common source connected FET first stage and a common base connected BJT second stage. In addition, it has a common collector configured BJT output stage. Specifically, FET 90 has its gate connected to receive input signals, its source connected to $-V_{CC}$ and its drain connected through current source 91 to $+V_{CC}$. Its drain is also direct coupled via conductor 92 to the emitter of BJT 95, whose base is connected via conductor 93 to a bias voltage, and whose collector connects through current source 94 to $+V_{CC}$. This stage is direct coupled to the base of BJT 96, whose collector connects to $+V_{CC}$, and whose emitter connects to output 11, and through current source 98 to $-V_{CC}$.

All of these embodiments feature the improved forward transimpedance and other performance characteristics previously mentioned. Additional embodiments include modifications to the embodiments of FIGS. 1–5 through the substitution of P-channel devices and/or PNP bipolar transistors, together with the corresponding changes in bias connections. Also, biasing can include different types of bias means and current sources as may be desired or appropriate for given applications. In any case, the bias currents are chosen so that the voltage and current gains of the amplifiers are adequate and so that the transimpedance amplifiers do not slew.

Figure 6B:
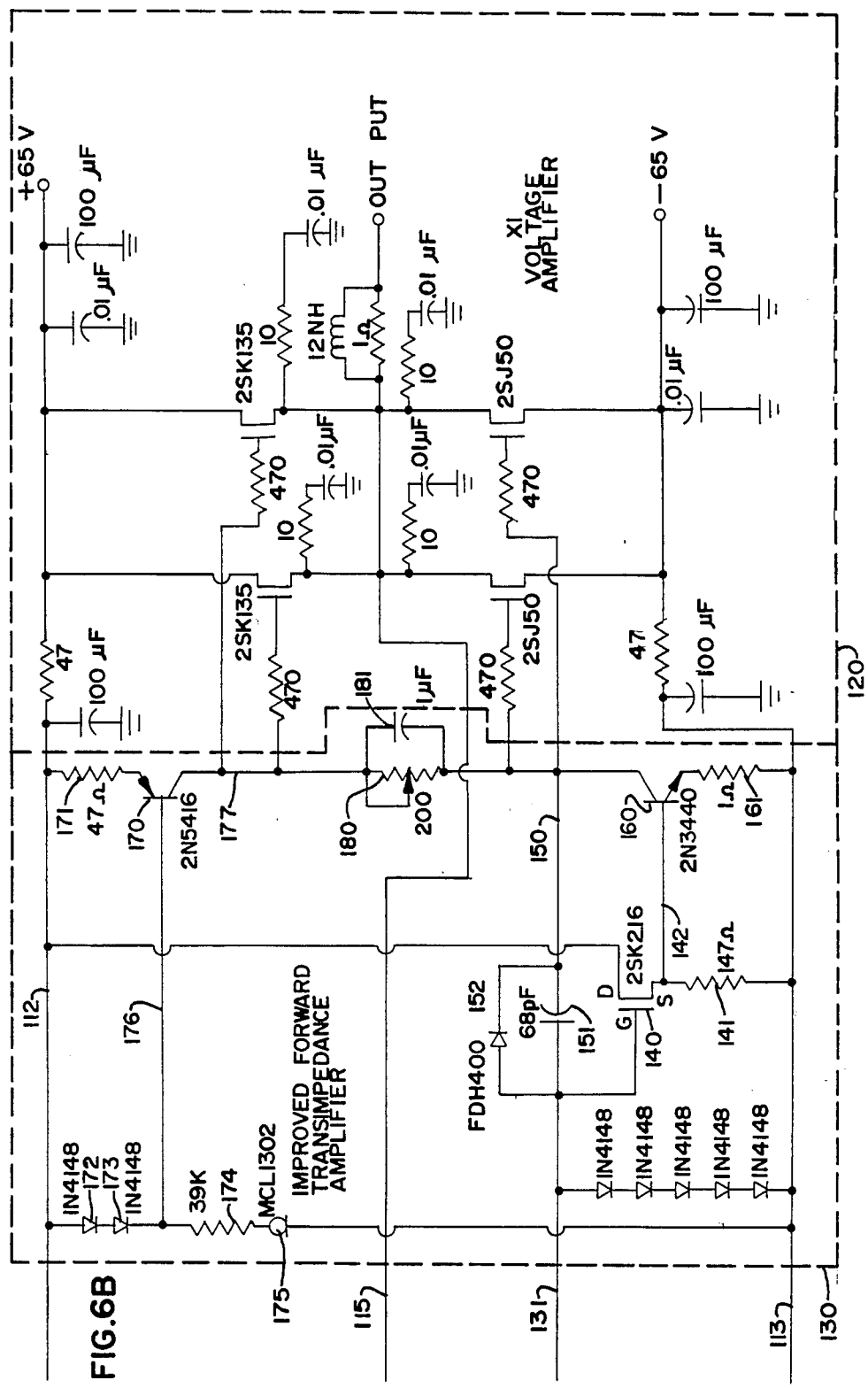

As previously mentioned, improved amplifiers according to the present invention can be used in a wide variety of applications, wherever amplifiers having improved performance characteristics are needed. By way of example, FIGS. 6a and 6b (which are referred to jointly as "FIG. 6" in the following discussion) show the use of a form of the improved forward transimpedance amplifier as a driver stage in a high-performance, high-fidelity audio amplifier. In FIG. 6, the signal input is applied to input 110, and this is applied to an input transconductance amplifier generally designated by reference number 111. This amplifier can be one of a number of known designs, and in the embodiment shown the differential input design is used where the input signals are applied to one transistor of the differential pair, and a feedback signal is applied via lead 115 from the amplifier output through a frequency tailoring network to the other transistor of the pair.

The voltage amplifier is indicated generally by reference number 120, and it includes a number of high-power MOSFET output transistors. Four of such output transistors are shown in the embodiment of FIG. 6, but a greater number could be used together with appropriate changes in biasing and power supply circuits, as is generally known, in order to provide the desired power output. The embodiment shown provides 100 watts of audio power. One characteristic of power MOSFETs that makes them very desirable for power amplifiers is their relative ruggedness which, in most cases, means that no specialized protective circuitry is needed, as is the case with other types of audio power amplifier outputs. This simplifies the design and reduces costs. However, one disadvantage of power MOSFETs is that they have a relatively high gate capacitance, and this can be a source of distortion and reduced performance if the driver stage is not capable of delivering instantaneously large currents to charge the gate capacitance. The improved forward transimpedance amplifier of the present invention provides an ideal solution to driving power MOSFETs, due to the low output impedance, high output current, high gain and very high slew rate.

The transimpedance amplifier used as a driver is generally indicated by reference number 130 in FIG. 6. It consists of a two-stage design, with the first stage including FET 140 connected in common drain configuration, and the second stage including BJT 160 connected in common emitter configuration. The input to amplifier 130 is at conductor 131. A stack of diodes connects from this conductor to the negative power supply conductor 113 and serves to protect FET 140 by limiting the maximum voltage that can appear across its source and gate terminals. This input conveys signals to be amplified to the gate of FET 140. The drain of FET 140 connects to the plus power supply 112, and the source connects through resistor 141, which in this case acts as the current source, or load, to the negative power supply 113. The source of FET 140 is also direct coupled to the base of BJT 160 via conductor 142. The emitter of this transistor connects through resistor 161 to the minus power supply 113. The purpose of resistor 161 is to provide local feedback around BJT 160. This makes the stage less dependent on sample-to-sample variations in the characteristics of BJT 160, and provides some high frequency stabilization against oscillations.

The collector of BJT 160 connects to conductor 150, which is the signal output. Feedback signals are taken from conductor 150 through capacitor 151 and its parallel diode 152 back to input 131. This provides negative feedback to control the gain of the transimpedance amplifier, and also to roll off high frequency response to stabilize the closed loop characteristics of the amplifier as a whole (i.e., high frequency compensation).

Bias for BJT 160 is provided through transistor 170 and associated components, which act as a constant current source in this application. Specifically, transistor 170 has its emitter connected through resistor 171 to the positive voltage supply 112. Its base is biased via conductor 176 which is connected to a bias source consisting of diodes 172, 173, resistor 174 and constant current diode 175 which are connected to the plus and minus power supplies. The collector circuit of transistor 170 connects through adjustable resistor 180 to conductor 150 and the collector of transistor 160.

Outputs from the transimpedance amplifier 130 are taken from conductor 150 to drive a pair of the MOSFETs, and from conductor 177 to drive the other pair. Resistance 180 is needed for biasing of the MOSFET power output stage. Although needed for the output stage, bias resistors such as 180 are undesirable in terms of a certain amount of adverse effect on the output of the driving stage. However, one advantage of the improved forward transimpedance amplifier 130 of this invention is that the bias resistor 180 can be completely bypassed by capacitor 181 for all audio frequencies, thus removing its adverse effects on circuit performance.

As compared with conventional drive circuits, the improved forward transimpedance amplifier 130 of FIG. 6 provides lower distortion, better frequency response, higher slew rates, and reduced sensitivity to device characteristics. Additionally, it has the advantage of eliminating output hum because the feedback is so high at low frequencies. It also has less DC drift and offset and better stability than conventional drive circuits. It has less tendency to produce thumps upon turn-on and turn-off, and better power supply rejection of 60-cycle hum, transients, etc. This means that a cheaper, less complex power supply can be used without any degradation in performance. In general, the improved transimpedance amplifier can be used to make existing designs better in performance, or to hold the performance of a product while making it simpler and cheaper.

Another use in audio is as a preamplifier, where it provides the ability to drive downstream amplifiers without a separate buffer amplifier.

While the above example has been given in terms of audio amplifiers, the same improved characteristics make the invention equally applicable to a wide variety of other electronic applications.

What is claimed is:

1. In a power amplifier of the type having MOSFET output devices, an improved transimpedance amplifier for driving said output devices, comprising:
    a field effect transistor first amplification stage;
    a bipolar junction transistor second amplification stage;
    input means for receiving signals to be amplified and applying them to said field effect transistor;
    means connected for direct coupling of signals from the output of the first amplification stage to the input of the second amplification stage;
    output means connected to receive amplified signals from the second amplification stage and connected for applying them to drive the gates of the MOSFET output devices; and
    Capacitive feedback means connected to convey negative feedback signals from the output means of said second amplification stage to the input means of said first amplification stage to control the transimpedance of the transimpedance amplifier and to shape the bandwidth of and improve the stability of the power amplifier.

2. An audio power amplifier, comprising:
    an input amplification stage for receiving input signals to be amplified;
    an output amplification stage for providing amplified output signals;
    means for providing negative feedback from the output of said output amplification stage to said input stage;
    a transimpedance amplifier stage connected intermediate to said input amplification stage and said output amplification stage, said transimpedance amplifier including
    a field effect transistor;
    a bipolar junction transistor;
    means connected for applying signals to be amplified from said input amplification stage to the gate of said field effect transistor;
    connection means for connecting said field effect transistor and said bipolar junction transistor as stages of the transimpedance amplifier, including bias means connected for supplying bias voltages or currents to said field effect transistor and said bipolar junction transistor, and including coupling means for directly coupling signals from the field effect transistor to the bipolar junction transistor;
    means connected to apply amplified signals from said bipolar junction transistor to drive said output amplification stage of said audio power amplifier; and
    capacitive feedback means connected for applying negative feedback from the output of the bipolar junction transistor to the gate of the field effect transistor to control the transimpedance of the transimpedance amplification stage and to shape the bandwidth of and improve the stability of the audio power amplifier.

3. An audio power amplifier, comprising:
    an input amplification stage for receiving input signals to be amplified;
    an output amplification stage for providing amplified output signals;
    means for providing an outer negative feedback loop from the output of said output amplification stage to said input stage;
    a transimpedance amplifier stage connected intermediate to said input amplification stage and said output amplification stage, said transimpedance amplifier including
    a field effect transistor;
    a bipolar junction transistor;
    means connected for applying signals to be amplified from said input amplification stage to the gate of said field effect transistor;
    connection means for connecting said field effect transistor and said bipolar junction transistor as a two-stage amplifier with the field effect transistor as the first stage and the bipolar junction transistor as the second stage, with one of said stages being signal inverting and the other non-inverting, including bias means connected to said field effect transistor and to said bipolar junction transistor for applying bias voltages or currents thereto, and coupling means for directly coupling signals from the field effect transistor to said bipolar junction transistor;
    means connected to apply amplified signals from said bipolar junction transistor to drive said output amplification stage of said audio power amplifier; and
    a feedback capacitor connected for applying negative feedback from the output of the bipolar junction transistor to the input of the field effect transistor to control the transimpedance of the transimpedance amplifier stage and to shape the bandwidth of and improve the stability of the audio power amplifier.

4. An amplifier according to claim 3, wherein said output amplification stage of said audio power amplifier includes MOSFET output devices, and wherein the output of said bipolar junction transistor of said transimpedance amplifier is connected for driving the gates of said MOSFETS.

5. An amplifier according to claim 3 wherein said field effect transistor is connected in common drain configuration, and wherein said bipolar junction transistor is connected in common emitter configuration.

* * * * *